(12) United States Patent
Yamada et al.

(10) Patent No.: US 8,785,786 B2
(45) Date of Patent: *Jul. 22, 2014

(54) WIRING BOARD AND METHOD OF MANUFACTURING THE SAME

(75) Inventors: Erina Yamada, Komaki (JP); Kazunaga Higo, Iida (JP); Hironori Sato, Kasugai (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 129 days.

This patent is subject to a terminal disclaimer.

(21) Appl. No.: 13/325,767

(22) Filed: Dec. 14, 2011

(65) Prior Publication Data

US 2012/0152597 A1 Jun. 21, 2012

(30) Foreign Application Priority Data

Dec. 15, 2010 (JP) ................................. 2010-279706

(51) Int. Cl.
*H05K 1/09* (2006.01)
*B23K 1/00* (2006.01)

(52) U.S. Cl.
CPC .................................... *B23K 1/0016* (2013.01)
USPC ......................................... 174/257; 174/258

(58) Field of Classification Search
CPC ............ B23K 1/0016; B23K 2201/42; H01L 21/4853; H01L 2224/16225; H01L 23/49816; H01L 24/16; H05K 2201/0341; H05K 2201/0367; H05K 2203/054; H05K 3/244; H05K 3/3473; H05K 3/4007
USPC ......................................... 174/257, 258–262
See application file for complete search history.

(56) References Cited

U.S. PATENT DOCUMENTS

| 6,229,220 | B1 | 5/2001 | Saitoh et al. |
| 7,216,424 | B2 | 5/2007 | Wang |
| 7,709,957 | B2 | 5/2010 | Ishii |
| 7,749,888 | B2 | 7/2010 | Nishiyama et al. |
| 8,299,616 | B2 * | 10/2012 | Chuang et al. ................ 257/758 |

(Continued)

FOREIGN PATENT DOCUMENTS

| JP | H02-198141 A | 8/1990 |
| JP | A-H09-97791 A | 4/1997 |

(Continued)

OTHER PUBLICATIONS

Office Action dated Sep. 6, 2013, in related U.S. Appl. No. 13/325,431.

(Continued)

*Primary Examiner* — Yuriy Semenenko
(74) *Attorney, Agent, or Firm* — Stites & Harbison PLLC; Jeffrey A. Haeberlin; James R. Hayne

(57) ABSTRACT

A wiring board including a conductor post corresponding to high-density packaging is provided. The wiring board may comprise a conductor layer, a solder resist layer laminated on the conductor layer, and a conductor post that is electrically connected to a conductor layer which is disposed in a lower portion of a through-hole provided in the solder resist layer, wherein the solder resist layer comprises a thermosetting resin; the conductor post comprises tin, copper, or a solder; the conductor post includes a lower conductor post, which is located within the through-hole and includes an external side surface and a lower end surface, and an upper conductor post, which is located above the lower conductor post and is projected outside the solder resist layer; and at least a part of a lower end surface of the upper conductor post is brought into intimate contact with an outer surface of the solder resist layer.

5 Claims, 8 Drawing Sheets

(56) References Cited

U.S. PATENT DOCUMENTS

| | | | |
|---|---|---|---|
| 8,318,596 B2* | 11/2012 | Kuo et al. | 438/613 |
| 8,501,616 B2* | 8/2013 | Liu et al. | 438/613 |
| 2002/0014705 A1* | 2/2002 | Ishio et al. | 257/784 |
| 2005/0029110 A1 | 2/2005 | Tang et al. | |
| 2009/0130840 A1* | 5/2009 | Wang et al. | 438/614 |
| 2010/0132998 A1 | 6/2010 | Lee et al. | |
| 2010/0230810 A1* | 9/2010 | Kang et al. | 257/737 |
| 2012/0152596 A1* | 6/2012 | Yamada et al. | 174/257 |
| 2012/0152598 A1* | 6/2012 | Yamada et al. | 174/257 |
| 2013/0213702 A1* | 8/2013 | Hsieh et al. | 174/257 |
| 2013/0214408 A1* | 8/2013 | Zhao et al. | 257/737 |

FOREIGN PATENT DOCUMENTS

| | | | |
|---|---|---|---|
| JP | A-H09-205096 A | 8/1997 |
| JP | 10-326965 A | 12/1998 |
| JP | 2000-68626 A | 3/2000 |
| JP | 2000-332395 A | 11/2000 |
| JP | 2004-119464 A | 4/2004 |
| JP | A-2006-279062 A | 10/2006 |
| JP | 2007-103878 A | 4/2007 |
| JP | A-2009-164442 A | 7/2009 |
| KR | 2010-60968 A | 6/2010 |

OTHER PUBLICATIONS

Korea Patent Office, Office Action issued in corresponding Korean application 10-2011-0135611, mailed Aug. 8, 2013.

JPO, Notification of Reasons for Refusal issued in corresponding Japanese application No. 2010-279706, dispatched Mar. 11, 2014.

* cited by examiner

WIRING BOARD AND METHOD OF MANUFACTURING THE SAME

CROSS-REFERENCE TO RELATED APPLICATIONS

The present application claims priority from Japanese Patent Application No. 2010-279706, which was filed on Dec. 15, 2010, the disclosure of which is herein incorporated by reference in its entirety.

BACKGROUND OF THE INVENTION

1. Field of the Invention

The present invention relates to wiring boards and methods of manufacturing the same. In more detail, embodiments of the present invention relate to wiring boards having a conductor post and methods of manufacturing such wiring boards.

2. Description of Related Art

In recent years, as a high-density packaging technique, for example, a C4 (controlled collapse chip connection) method has been adopted. Wiring boards utilized in C4 methods have surface that is covered by a solder resist layer, and wherein a bump (conductor post) is vertically arranged, in an optionally bored opening in the solder resist layer, and electrically connected to a conductor layer within the wiring board. Such wiring boards that may be used the C4 methods, and which have such a connection with the bump, may attain bump pitches as low as 145 μm with the progress of high-purity packaging. However, it is expected that high-density packaging will further proceed in the future, and may require narrower bump pitches (for example, 100 μm). These narrower bump pitches require smaller diameter openings to be bored in the solder resist layer. On the other hand, the required height of bumps may be kept constant in the future. That is, it may be necessary for bumps to have shapes with higher aspect ratios.

Current conventional technologies are described in Japanese Patent Publication No. H9-205096, Japanese Patent Publication No. JP-2009-164442, Japanese Patent Application No. JP-2006-279062, U.S. Pat. No. 7,216,424, U.S. Pat. No. 6,229,220, and U.S. Patent Publication No. 2005/0029110.

BRIEF SUMMARY OF THE INVENTION

The formation of bumps having high aspect ratios required for the foregoing high-density packaging is relatively difficulty. These general bump forming methods include solder printing and ball mounting.

The solder printing method is a method in which a screen mask 22 is used, and a paste solder 30 is printed using a squeegee 21, thereby forming a bump. As illustrated in FIG. 10, in the case where a solder resist layer 13 is thin and a size of a through-hole 131 opened in the solder resist layer 13 is sufficient, the paste solder 30 can usually be printed on a conductor layer 12a.

However, in the case where a solder resist layer 13 is thick or in the diameter of a through-hole 131 formed in the solder resist layer 13 is small, the fabrication of the mask 22 per se is difficult, and it is also difficult to sufficiently ensure its precision. Furthermore, even when a mask 22 can be formed, the diameter of the through-hole 131 opened in the mask 22 is small, which causes problems such as clogging within the mask 22 occur; and the paste solder 30 being hardly printed. Also, as illustrated in FIG. 11, even when the paste solder 30 can be printed, the printed paste solder 30 may have difficulty in coming into contact with the conductor layer 12a.

On the other hand, the ball mounting method is a method in which a previously formed solder ball 40 is joined onto the conductor layer 12a of a leading-out object and is utilized as a bump. As illustrated in FIG. 12, in the case where the solder resist layer 13 is thin and the size of the through-hole 131 opened in the solder resist layer 13 is sufficient, the solder ball 40 can connect with the conductor layer 12a.

However, in the case where the solder resist layer 13 is thick or in the case where the diameter of the through-hole 131 formed in the solder resist layer 13 is small, and when the solder ball 40 used has a size that conforms with the diameter of the through-hole 131, a sufficient bump height cannot be ensured. On the other hand, as illustrated in FIG. 13, when the diameter of the solder ball 40 is made large for the purpose of ensuring the height of the bump, the solder ball's 40 curvature decreases, so that the solder ball 40 cannot be brought into contact with the conductor layer 12a beneath the solder resist layer 13 ("cissing"). Also, there is a concern that adjoining solder balls 40 connected to each other ("bridge").

As a substitute method to these conventional general-purpose methods, one may use a method of plating a bump. However, in general, since plating solutions are corrosive to resin layers, the solder resist layer formed by adopting a photolithography method may not exhibit sufficient corrosion resistance. Also, though it may be necessary to use a frame layer to determine the outline of a bump in when plating a bump, it is difficult to sufficiently get the opening that forms in this frame layer to coincide with the opening formed in the solder resist layer.

It is an object of the present invention to provide a wiring board that addresses the above-discussed long felt needs, among others.

In view of the foregoing circumstances, the invention has been made, and an object thereof is to provide a wiring board including a conductor post corresponding to the high-density packaging and a method of manufacturing the same, as follows:

(1) A wiring board comprising a conductor layer, a solder resist layer laminated on the conductor layer, and a conductor post that is electrically connected to a conductor layer which is disposed in a lower portion of a through-hole provided in the solder resist layer, wherein the solder resist layer comprises a thermosetting resin; the conductor post comprises tin, copper, or a solder;

the conductor post includes a lower conductor post, which is located within the through-hole and includes an external side surface and a lower end surface, and an upper conductor post, which is located above the lower conductor post and is projected outside the solder resist layer; and at least a part of a lower end surface of the upper conductor post is brought into intimate contact with an outer surface of the solder resist layer.

(2) The wiring board according to (1), wherein the lower end surface of the upper conductor that is brought into intimate contact with the outer surface of the solder resist layer comprises palladium.

(3) The wiring board according to (1), wherein the external side surface of the lower conductor post that is brought into intimate contact with an internal side surface of the through-hole of the solder resist layer comprises palladium.

(4) The wiring board according to (1), wherein at least a part of the lower end surface of the lower conductor post that is brought into intimate contact with the conductor layer comprises nickel and gold.

(5) The wiring board according to (1), wherein the conductor post comprises tin; and the external side surface and the lower end surface of the lower conductor post of the conductor post include, respectively, an external alloy layer and a lower end alloy layer that comprise copper and tin.

(6) The wiring board according to (5), wherein the external alloy layer is thicker than the lower end alloy layer.

(7) A method for manufacturing of a wiring board, comprising, in the following order:

a solder resist layer forming process for forming a solder resist layer comprising a thermosetting resin on a surface of a plain substrate having a conductor layer provided on the surface thereof;

a first through-hole boring process for boring a first through-hole in the solder resist layer;

a photoresist layer forming process for forming a photoresist layer that covers the plain substrate;

a second through-hole boring process for boring a second through-hole in the photoresist layer using photolithography, the second through-hole being in communication with the first through-hole and having a diameter larger than that of the first through-hole;

a conductor post forming process for plating a conductor post comprising tin, copper, or a solder within the first through-hole and the second through-hole; and a photoresist layer removing process for removing the photoresist layer.

(8) The method of manufacturing a wiring board according to (7), further comprising an electroless plated layer forming process for coating a palladium-containing catalyst on an outer surface of the solder resist layer to form an electroless plated layer comprising copper; and wherein the electroless plated layer forming process occurs after the first through-hole boring process and before the photoresist layer forming process.

(9) The method of manufacturing a wiring board according to (8), wherein the electroless plated layer forming process further comprises coating the palladium-containing catalyst within the first through-hole of the solder resist layer.

(10) The method of manufacturing a wiring board according to (9), further comprising an intervening layer forming process for forming an electrically conductive intervening layer comprising nickel and gold on the surface of the conductor layer exposed within the first through-hole; and wherein the intervening layer forming process occurs before the electroless plated layer forming process.

(11) The method of manufacturing a wiring board according to (7), further comprising a conductor post heating process for plating the conductor post within the first through-hole and the second through-hole and heating the conductor post after the photoresist layer forming process; and wherein the conductor post comprises tin.

Embodiments of the wiring board of the present invention allow for the high-density packaging of conductor posts 16. That is, the wiring boards 10 may have conductor posts 16 with larger aspect ratios (proportion of height to width) than those in the related art. Accordingly, even for conductor posts 16 with small pitches, sufficient height from the surface of the solder resist layer can be attained. Furthermore, high connection reliability can be achieved between the wiring board 10 and a part to be packaged in this wiring board 10 by using a conductor post 16.

In the case where palladium is contained in a lower end surface 162*b* of an upper conductor post 162 brought into intimate contact with an outer surface 132 of a solder resist layer 13, the wiring board 10 exhibit excellent joining strength between the outer surface 132 of the solder resist layer 13 and the conductor post 16.

In the case where palladium is contained in an external side surface 161*c* of a lower conductor post 161 that is brought into intimate contact with an internal side surface 131*c* of a through-hole 131 of the solder resist layer 13, the wiring board 10 exhibits excellent joining strength between the inside of the solder resist layer 13 and the conductor post 16 and more excellent joining strength with the conductor post 16.

In the case where nickel and gold are contained in an intimate contact site 161*b* of a lower conductor post 161 with a conductor layer 12*a* (e.g. at least a part of the lower end surface of the lower conductor), the wiring substrate 10 exhibits an excellent joining strength between the conductor post 161 and the conductor layer 12*a*.

In the case where the conductor post 16 is composed of tin, and each of the external side surface 161*c* and the lower end surface 161*b* of the lower conductor post 161 of the conductor post 16 has an alloy layer 165 containing copper and tin (e.g. the external alloy layer 165*c* and the lower end alloy layer 165*b*), the wiring substrate 10 exhibits excellent joining strength between the conductor post 161 and the internal side surface 131*c* of the through-hole 131 formed in the solder resist layer 13 as well as the conductor layer 12.

In the case where an external alloy layer 165*c* of the alloy layer 165 located at the external side surface 161*c* of the lower conductor post 161 is thicker than a lower end alloy layer 165*b* of the alloy layer 165 located at the lower end surface 161*b* of the lower conductor post 161, the wiring board 10 which exhibits excellent joining strength between the conductor post 161 and the internal side surface 131*c* of the through-hole 131 formed in the solder resist layer 13 as well as the conductor layer 12.

In accordance with a manufacturing method of a wiring board according to the present invention, it is possible to achieve the high-density packaging of a conductor post 16. That is, a wiring board 10 in which the conductor post 16 has a larger aspect ratio (proportion of height to width) than those in the related art can be obtained. Furthermore, even for wiring boards 10 having conductor posts 16 with a small pitch, sufficient height from the surface of the solder resist layer can be obtained. Consequently, embodiments of wiring boards 10 are capable of achieving highly reliability connections between the wiring board 10 and a part to be packaged.

Using an electroless plated layer forming process PR4, which comprises coating a palladium-containing catalyst on the outer surface 132 of the solder resist layer 13 to form a copper-containing electroless plated layer 14 after a first through-hole boring process PR2 but before a photoresist layer forming process PR5, the resulting wiring board 10 exhibits excellent joining strength between the surface 132 of the solder resist layer 13 and the conductor post 16.

In the case where a palladium-containing catalyst is also used to coat within the first through-hole 131 of the solder resist layer 13 in the electroless plated layer forming process PR4, the wiring board 10 again exhibits an excellent joining strength between the internal side surface 131*c* of the through-hole 131 and the conductor post 16, in addition to the joining strength between the outer surface 132 of the solder resist layer 13 and the conductor post 16.

In the case where an intervening layer forming process PR3, which forms an electrically conductive intervening layer 17 comprising nickel and gold on the surface of the conductor layer 12*a* exposed within the first through-hole 131 before the electroless plated layer forming process PR4, the wiring board 10 exhibits more excellent joining strength between the conductor post 161 and the conductor layer 12a.

In the case where the conductor post 16 composed of tin and is plated within both the first through-hole 131 and a second through-hole 151 in a conductor post forming process PR7, and a conductor post heating process PR10 of heating the conductor post 16 is included after a photoresist layer removing process PR8, the wiring board 10 has highly accurate conductor post 16 positional and excellent joining strength between the conductor post 161 and the conductor layer 12a.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
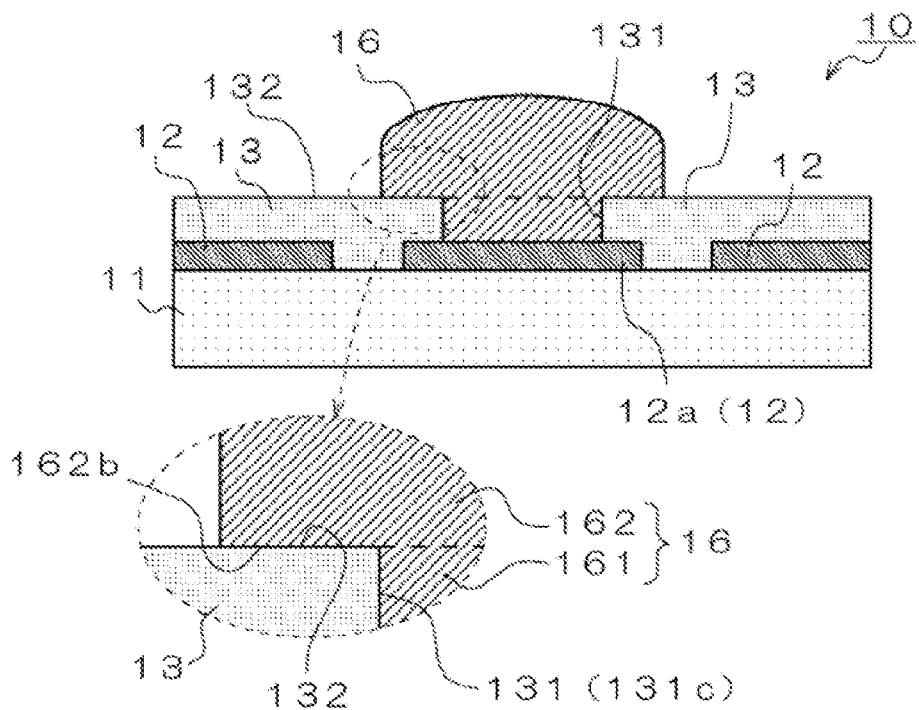
FIG. 1 is a schematic sectional view showing a wiring board in an embodiment.

The embodiment of the present invention is hereunder described in detail by reference to FIGS. 1 to 8.

A wiring board 10 of the invention is a wiring board comprising a conductor layer 12, a solder resist layer 13 laminated on the conductor layer 12, and a conductor post 16 that is electrically connected to a conductor layer 12a which is disposed in a lower portion of a through-hole 131 provided in the solder resist layer 13, wherein the solder resist layer 13 contains a thermosetting resin, and the conductor post 16 is composed mainly of tin, copper, or a solder;

the conductor post 16 includes a lower conductor post 161 located within the through-hole 131 and an upper conductor post 162 located above the lower conductor post 161 and projected outside the solder resist layer 13, and a part of a lower end surface 162b of the upper conductor post 162 is brought into intimate contact with an outer surface 132 of the solder resist layer 13.

The foregoing "wiring board (10)" comprises a conductor layer 12, a solder resist layer 13, and a conductor post 16.

Above all, the foregoing "conductor layer (12)" is a layer that functions as a conductor circuit or the like in a wiring board 10. The conductor layer 12 may be composed of a series (namely, a continuous single sheet) of conductors, or may be composed of a plurality of conductors arranged within the same plane. Also, among the conductor layers 12, the conductor layer which is disposed in a lower portion of the through-hole 131 bored in the solder resist layer 13 as described later is a conductor layer 12a. This conductor layer 12a may be an independent single conductor within the conductor layer 12, or may be a part of continuous conductors. Also, the shape or the like of the conductor layer 12 is not particularly limited. Also, though the material of the conductor layer 12 is not particularly limited, and it is preferably copper, a copper alloy, aluminum, an aluminum alloy, or the like. Copper may be used.

The foregoing "solder resist layer (13)" is a layer that is laminated on the conductor layer 12. In general, the solder resist layer 13 functions as a layer that prevents attachment of a solder to an unintended site during the reflow process, which is utilized during packaging a part in a wiring board. Other layers, such as insulating layers, may be allowed to intervene between the solder resist layer 13 and the conductor layer 12.

Though the thickness of this solder resist layer 13 is not particularly limited, it is preferably 1 μm or more and not more than 100 μm. When the thickness of the solder resist layer 13 falls within this range and the configuration of the invention is adopted, the foregoing various effects are more easily obtainable. However, the thickness of this solder resist layer 13 is more preferably 5 μm or more and not more than 50 μm, and especially preferably 10 μm or more and not more than 40 μm.

Furthermore, the solder resist layer 13 of the wiring board of the invention comprises a thermosetting resin. When the solder resist layer 13 comprises a thermosetting resin, it is possible to impart resistance to a plating solution (in particular, alkali resistance) while preventing unnecessary attachment of a solder during the reflow process. Accordingly, it is possible to form at least one of an electroless plating or an electroplating on the surface of the conductor layer 12a beneath the solder resist layer 13.

Though the kind of the thermosetting resin is not particularly limited, examples thereof include epoxy resins, polyimide resins, phenol resins, bismaleimide-triazine resins, cyanate resins, and polyamide resins. Of these, epoxy resins are especially preferable. Examples of the epoxy resins include novolak type resins such as phenol novolak types and cresol novolak types; and dicyclopentadiene-modified alicyclic epoxy resins. These resins may be used singly or in combination with two or more kinds thereof.

Though an amount of the thermosetting resin which is contained in the solder resist layer 13 is not particularly limited, in general, the thermosetting resin is contained in the largest amount (in terms of a volume) in an organic material that constitutes the solder resist layer 13. That is, the thermosetting resin is a main component in the organic material that constitutes the solder resist layer 13. More specifically, when the amount of the organic material constituting the solder resist layer 13 is defined as 100% by volume, it is preferable that the thermosetting resin be contained in an amount exceeding 50% by volume, up to 100% by volume. Though the content of the thermosetting resin in the organic material constituting the solder resist layer 13 is not particularly limited, it may be preferably more than 50% by volume and not more than 100% by volume, and more preferably 80% by volume or more and not more than 100% by volume. Also, examples of organic materials other than thermosetting resins that can be contained in the solder resist layer 13 include rubbers and thermoplastic resins.

Also, in addition to the organic material inclusive of the foregoing thermosetting resin, a filler (for example, various fillers, e.g., silica, alumina, etc.; in general, an inorganic material) or the like may be contained in the solder resist layer. In the case where a filler is contained, when the whole of the solder resist layer 13 is defined as 100% by mass, the content of the filler may be less than 70% by mass.

Also, the solder resist layer 13 has a through-hole 131, and the conductor layer 12a is located in a lower portion of this through-hole 131. The conductor layer 12a is connected to the conductor post 16 via the through-hole 131 and may be electrically connected to the outside of the solder resin layer 13.

The planar shape of the through-hole 131 is not particularly limited, and it may be a circular shape, a polygonal shape, such as a quadrilateral shape, or other shape. A circular shape may be preferable. Also, though the size of this through-hole 131 is not particularly limited, in general, it is sized such that only part of the conductor layer 12a is exposed (namely, it is preferable that the whole of the conductor layer 12a not be exposed). Furthermore, in general, the size of the opening of the through-hole 131 may be equal to the size of the lower conductor post 161, and the depth of the through-hole 131 may be equal to the depth of the solder resist layer 13. Also, decreasing the diameter of the through-hole 131 may increase the advantageous effects obtainable from embodiments of the invention. More specifically, in the case where the planar shape of the through-hole 131 is circular, it is preferable that not only its diameter d161 be 10 µm or more and not more than 300 µm, but its depth (thickness of the solder resist layer 13) be 1 µm or more and not more than 100 µm. In wiring boards 10 including such a through-holes 131, advantageous effects may be more more easily obtainable. It is preferable that this diameter d161 be 30 µm or more and not more than 150 µm, and the depth be 5 µm or more and not more than 50 µm; and it is especially preferable that the diameter be 40 µm or more and not more than 100 µm, and the depth be 10 µm or more and not more than 40 µm.

The foregoing "conductor post (16)" is a conductor which is electrically connected to the conductor layer 12a disposed in a lower portion of the through-hole 131 which is provided in the solder resist layer 13. Then, the conductor post 16 functions as a conductor for the conductor layer 12a disposed in a lower portion of the through-hole 131 in the solder resist layer 13.

Also, the conductor post 16 is a conductor comprising tin, copper, or a solder. When the conductor post 16 is composed mainly of tin, the whole conductor post 16 being defined as 100% by mass, the content of Sn is 95% by mass or more (preferably 97% by mass or more; the content of Sn may also be 100% by mass). Also, the conductor post 16 may comprise metal elements other than Sn, including Cu, Ag, Zn, In, Bi, Sb, and Pb. These metal elements may be contained singly or in combination with two or more kinds thereof. However, the conductor posts 16 without an external alloy layer 165c and a lower end alloy layer 165b, as described later, typically do not contain Pd.

Similarly, the conductor post 16 is composed mainly of copper when, if the whole of the conductor post 16 is defined as 100% by mass, the content of Cu is 95% by mass or more (preferably 97% by mass or more; the content of Cu may also be 100% by mass). Also, when the conductor post 16 may contain metal element other than Cu, such as Sn. These metal elements may be contained singly or in combination with two or more kinds thereof. However, the conductor posts 16 without an the external alloy layer 165c and lower end alloy layer 165b, as described later, typically do not contain Pd.

Furthermore, the conductor post 16 is composed mainly of a solder when, if the whole of the conductor post 16 is defined as 100% by mass, a total content of two or more members selected from the group consisting of Sn, Ag, Cu, Zn, Al, Ni, Ge, Bi, In, Pb, and Au is 95% by mass or more (preferably 97% by mass or more; the total content may also be 100% by mass). More specifically, examples of solder that can be used in a conductor post 16 include an SnPb solder, an SnBi solder, an SnAgCu solder, an SnZnBi solder, an SnCu solder, an SnAgInBi solder, an SnZnAl solder, and an SnCuNiGe solder. However, in conductor posts 16 without an external alloy 163c and low end alloy 163b layers, as described later, Pd is typically not contained. Incidentally, the melting point of a conductor post 16 is generally 180° C. or higher and may be below 250° C.

Also, the conductor post 16 includes the lower conductor post 161 located within the through-hole 131 and the upper conductor post 162 located above the lower conductor post 161 and projected outside the solder resist layer 13. In other words, the upper conductor post 162 projecting outside the solder resist layer 13 means that the upper conductor post 162 is projected toward the outside of the solder resist layer 13. According to this, the conductor post 16 is configured such that it is projected from the surface of the wiring board 10 and is able to package a part therein.

Though a shape (inclusive of a planar shape and a side surface shape) of the upper conductor post 162 is not particularly limited, for example, the planar shape can be a circular shape, a quadrilateral shape, or the like. Also, the side surface shape (shape of side section) can be a substantially circular shape, a semicircular shape (umbrella shape, bowl shape, etc.), a quadrilateral shape, or the like.

Furthermore, at least a part of the lower end surface 162b of the upper conductor post 162 is brought into intimate contact with the outer surface 132 of the solder resist layer 13. That is, in other words, by forming the lower end surface 162b of the upper conductor post 162 larger than an upper end surface 161a of the lower conductor post 161, at least a part of the lower end surface 162b of the upper conductor post 162 is brought into intimate contact with the outer surface 132 of the solder resist layer 13. In view of such a structure, the conductor post 16 is joined to the conductor layer 12a directly or indirectly via another layer, and the conductor post 16 is brought into intimate contact with the solder resist layer 13. Therefore, the conductor post 16 is arranged firmly with respect to the wiring board.

There are no particular limitations with respect to the lower end surface 162b of the upper conductor post 162 being formed larger than the upper end surface 161a of the lower conductor post 161. However, it is preferable that an area of the lower end surface 162b of the upper conductor post 162 be more than 1.0 times and not more than 25.0 times an area of the upper end surface 161a of the lower conductor post 161. In this range, it is possible to obtain sufficient intimate contact between the lower end surface 162b of the upper conductor post 162 and the outer surface 132 of the solder resist layer 13 while making a pitch between the conductor posts 16 small. Furthermore, this value is more preferably more than 1.0 time and not more than 9.0 times, and especially preferably more than 1.0 time and not more than 4 times. In these ranges, especially excellent effects may be obtainable.

Figure 2:
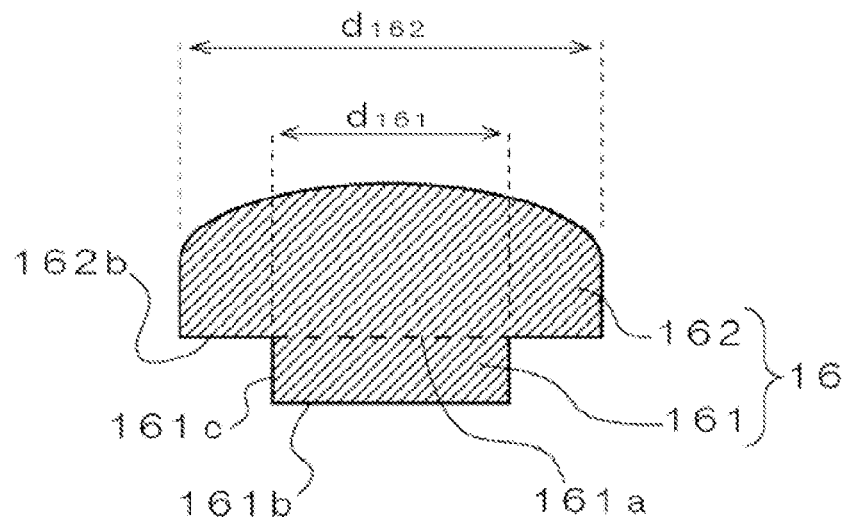
FIG. 2 is a schematic sectional view showing a conductor post arranged in a wiring board in an embodiment.

More specifically, where the planar shapes of both of the lower conductor post 161 and the upper conductor post 162 are circular, as shown in FIG. 2, and a diameter of the lower end surface 162b of the upper conductor post 162 being defined as d162 and a diameter of the upper end surface 161a of the lower conductor post 161 being defined as d161, d162/d161 is preferably more than 1.0 and not more than 5.0, more preferably more than 1.0 and not more than 3.0, and especially preferably more than 1.0 and not more than 2.0.

Furthermore, in embodiments of wiring boards 10 the lower end surface 162b of the upper conductor post 162 brought into intimate contact with the outer surface 132 of the solder resist layer 13 may comprise palladium. In such cases, the conductor post 16 is able to exhibit an especially excellent joining strength to the outer surface 132 of the solder resist layer 13.

Such palladium may be applied previously for the purpose of forming an electroless plated layer 14. In general, palladium is coated as a catalyst containing palladium in the electroless plated layer 14 form on the outer surface 132 of the solder resist layer 13 (see the form after a process PR9 in FIG. 6, and the like). Then, since this electroless plated layer 14 becomes a part of the conductor post 16, palladium is contained in the lower end surface 162b of the upper conductor post 162 and may reinforce the joining strength of the solder resist layer 13 to the conductor post 16. Also, when heating is applied in the manufacturing process for a wiring board 10, the electroless plated layer 14 and the conductor post 16 form an alloy at an interface therebetween (e.g., the alloy layer 165 is formed). Heating may be performed at 250° C. or higher. The electroless plated layer 14 may be absent within a wiring board 10, and palladium may be contained within the alloy layer 165 that constitutes the outer surface of the conductor post 16 (see FIG. 3).

Furthermore, in certain embodiments of the wiring boards 10, the external side surface 161c of the lower conductor post 161, which is brought into intimate contact with an internal side surface 131c of the through-hole 131 of the solder resist layer 13, may comprise palladium. In the case where palladium is contained in this external side surface 161c, the conductor post 16 exhibit an especially excellent joining strength to the internal side surface (inner wall surface) 131c of the through-hole 131 of the solder resist layer 13.

Similar to when palladium is in the lower end surface 162b of the upper conductor post 162, this palladium may be previously applied for the purpose of forming the electroless plated layer 14. In general, palladium is coated as a catalyst containing palladium. Then, this palladium in the electroless plated layer 14 forms on the internal side surface 131c of the solder resist layer 13 (see the form after a process PR9 in FIG. 6, and the like). Then, since this electroless plated layer 14 becomes a part of the conductor post 16, palladium is contained in the external side surface 161c of the lower conductor post 161 and may help reinforce the joining strength between the solder resist layer 13 and the conductor post 16. Also, when heat is applied such to manufacture a wiring board 10, the electroless plated layer 14 and the conductor post 16 may form an alloy at an interface therebetween (e.g., the alloy layer 165 is formed). Heating may be performed at 250° C. or higher. The electroless plated layer 14 may be absent within the wiring board 10, and palladium may be within the alloy layer 165 that constitutes the outer surface of the conductor post 16 (see FIG. 3).

When palladium is contained in the conductor post 16, namely, the lower end surface 162b of the upper conductor post 162, which is brought into intimate contact with the outer surface 132 of the solder resist layer 13, or when palladium is contained in the external side surface 161c of the lower conductor post 161, which is brought into intimate contact with the internal side surface 131c of the through-hole 131 of the solder resist layer 13, in general, palladium is contained within 5 µm of the outer surface of the conductor post 16. This width may comprise the electroless plated layer 14 (see the form after a process PR9 in FIG. 6), or may comprise the alloy layer 165 (see FIG. 3) within the conductor post 16.

Furthermore, the intimate contact site 161b of the lower conductor post 161 with the conductor layer 12a may comprise nickel and gold. When nickel and gold are contained in this intimate contact site 161b, the joining strength between the lower conductor post 161 and the conductor layer 12a is enhanced. Such nickel and gold can be contained in the intimate contact site 161b by forming an intervening layer 17 when manufacturing a wiring board, as described later.

In this intimate contact site 161b, in addition to nickel and gold, other components can also be contained. Examples of other component include palladium.

In particular, when the conductor post 16 is composed mainly of tin or a solder, when nickel and gold are simultaneously contained in the intimate contact site 161b, the formation of a component that lowers the joining strength of the intimate contact site 161b (for example, a component in which the respective metal elements are contained in a composition ratio of Cu to Sn of 6/5) can be effectively suppressed. As a result, the conductor post 16 has an increased joining strength.

When nickel and gold are contained in the intimate contact site 161b, in general, nickel and gold are contained within 100 µm of the outer surface of the lower conductor post 161.

Figure 3:
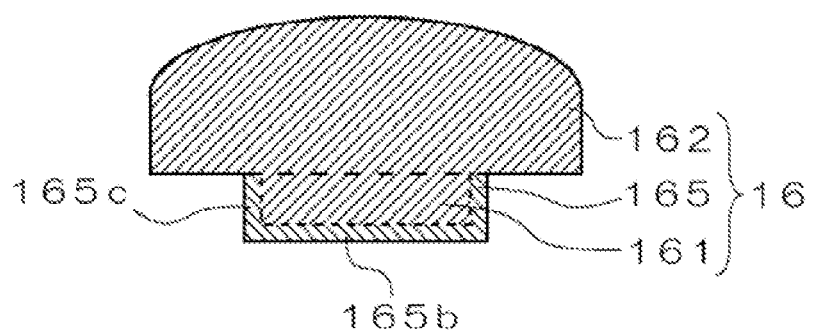
FIG. 3 is a schematic sectional view showing a conductor post arranged in a wiring board in an embodiment.

Also, when the conductor post 16 is made of tin, an alloy layer 165 comprising copper and tin can be contained in the external side surface 161c and lower end surface 161b of the lower conductor post 161 of (see FIG. 3). This alloy layer 165 is formed when heat is applied such that the electroless plated layer 14 and the conductor post 16 form an alloy at an interface therebetween (namely, the alloy layer 165 is formed) (the temperature may be a melting point of the conductor post 16 or higher, for example, heating may be performed at 250° C. or higher). In embodiments with an alloy layer 165, the joining strength of the whole conductor post 16 to the solder resist layer 13 is especially enhanced, so that the conductor post 16 has an excellent joining strength.

Furthermore, it is preferable that an external alloy layer 165c of the alloy layer 165, which is located on the external side surface 161c of the lower conductor post 161, be thicker than a lower end alloy layer 165b of the alloy layer 165, which is located on the lower end surface 161b of the lower conductor post 161. This may form a conductor post 16 having excellent joining strength. The external alloy layer 165c may be thicker than that of the lower end alloy layer 165b.

Incidentally, the thickness of the external alloy layer 165c is an average value of the thickness at five points in the center portion of the lower conductor post 161 (center portion of three equally dimensioned portions). Also, the thickness of the lower end alloy layer 165b is measured in the center portion of the lower conductor post 161 when planarly viewed.

Also, the wiring board can be provided with other configuration other than the solder resist layer, the conductor layer, and the conductor post. Examples of other configuration include a core substrate, an insulating layer, and an interior part.

Of these, the core substrate is an insulating material and is generally a plate-shaped material. Also, the core substrate can form a central portion in a thickness direction of the wiring board 10. As the insulating material constituting the core substrate, an insulating resin is preferable, and examples thereof include epoxy resins and bismaleimide-triazine resins. Also, a reinforcing material (for example, reinforcing fibers such as glass fibers), a filler (for example, various fillers such as silica and alumina), and the like may be contained in the core substrate. For example, fiber reinforced resin plates such as a glass fiber reinforced epoxy resin plate, heat resistant resin plates such as a bismaleimide-triazine resin plate, and the like can be used as the core substrate. Also, this core substrate may be composed of a plurality of layers, and furthermore, it may have a conductor layer (inner layer pattern) in the inside thereof. Also, the insulating layer functions to insulate a space between the conductor layers laminated on the core substrate. This insulating layer can comprise of the same insulating material as the insulating material that comprises the core substrate.

Furthermore, where a wiring board includes an accommodating part in the inside thereof, the wiring board is able to have an interior part within the accommodating part.

The planar shape of the accommodating part is not particularly limited. For example, it may be a substantially quadrilateral shape (inclusive of a quadrilateral and a quadrilateral whose corners are chamfered), a substantially circular shape (inclusive of a true circular shape and an elliptical shape), or the like. Also, examples of the interior part include a capacitor, an inductor, a filter, a resistor, and a transistor. These materials may be used singly or in combination of two or more kinds thereof. Of these, a capacitor is preferable, and in particular, a laminated ceramic capacitor is suitable. Furthermore, a filling part where insulating material has the function to relieve thermal expansion coefficient characteristics between the interior part and the core substrate can be included in a gap between the interior part internally installed within the accommodating part and the accommodating part. In general, the filling part comprises a resin such as epoxy resins, silicone resins, polyimide resins, bismaleimide-triazine resins, urethane resins, and phenol resins, or it may comprise a mixture of such resins and an inorganic filler such as ceramics with a low thermal expansion (for example, silica, alumina, etc.), dielectric ceramics (for example, barium titanate, strontium titanate, lead titanate, etc.), heat-resistant ceramics (for example, alumina nitride, boron nitride, silicon carbide, silicon nitride, etc.), and glasses (for example, borosilicate based glass, etc.).

Below is described a method for manufacturing method a wiring board in accordance with an embodiment of the present invention:

A method for manufacturing a wiring board 10, which comprises a solder resist layer forming process PR1, a first through-hole boring process PR2, a photoresist layer forming process PR5, a second through-hole boring process PR6, a conductor post forming process PR7, and a photoresist layer removing process PR8, in this order.

The foregoing "solder resist layer forming process (PR1)" is a process of forming the solder resist layer 13 containing a thermosetting resin on a surface of a plain substrate 20 having the conductor layer 12 provided on the surface thereof (though the conductor layer 12 may be formed entirely on the surface of the plain substrate 20, in general, it is formed in a part of the surface of the plain substrate 20). Though the configuration of the plain substrate 20 is not particularly limited, it can include, in addition to the conductor layer 12, a core substrate, an insulating layer, and the like. That is, for example, a substrate, including the conductor layer 12, may be a double-sided copper-clad plate with a glass epoxy core 11 that is subjected to patterning and can be utilized as the plain substrate 20. Furthermore, for example, plain substrates 20 where a double-sided copper-clad plate composed of glass epoxy as a core is used as a core substrate allow for an insulating layer to be successively built up. A conductor layer connected between the respective insulating layers can be provided. Also, the patterned conductor layer 12 may be disposed on the topmost surface thereof.

The method of forming the solder resist layer 13 on the plain substrate 20 is not particularly limited, and the solder resist layer 13 can be obtained by (1) a method in which a liquid solder resist composition is coated as a film on the surface of the plain substrate 20, followed by drying and/or curing (semi-curing), if desired. Furthermore, the solder resist layer 13 can be obtained by (2) a method in which a dry film serving as the solder resist layer 13 is stuck on the surface of the plain substrate 20, followed by drying and curing (semi-curing), if desired. Also, when utilizing the foregoing method (1), the liquid solder resist composition can be coated on the plain substrate 20 by an appropriate coating method such as spin coating, cast coating, and roll coating. Incidentally, the thickness of the solder resist layer 13 is the same as described above.

The foregoing "first through-hole boring process (PR2)" is a process of boring a first through-hole 131 in the solder resist layer 13. In this process, the first through-hole 131 may be formed by adopting a photolithographical method or a laser boring method. Incidentally, as for the first through-hole 131, the description regarding forming the through-hole 131 in the solder resist layer 13 described above can be applied.

The foregoing "photoresist layer forming process (PR5)" is a process of forming a photoresist layer 15 so as to cover the plain substrate 20 obtained prior to this stage. That is, this process is a process of forming the photoresist layer 15 on the solder resist layer 13 having at least the first through-hole 131 bored therein directly or indirectly via another layer.

The method of forming the photoresist layer 15 is not particularly limited, and the photoresist layer 15 can be obtained by (1) a method in which a liquid photoresist composition is coated on the surface of the solder resist layer 13 directly or indirectly via another layer, followed by drying and/or curing (semi-curing), if desired. Furthermore, the photoresist layer 15 can be obtained by (2) a method in which a dry film serving as the photoresist layer 15 is stuck on the surface of the solder resist layer 13 directly or indirectly via other layer, followed by drying and/or curing (semi-curing), if desired. When utilizing the foregoing method (1), the liquid photoresist composition can be coated on the solder resist layer 13 by an appropriate coating method such as spin coating, cast coating, and roll coating. On the other hand, in the case of utilizing the foregoing method (2), the dry film can be brought into intimate contact with the solder resist layer 13 upon being pressed. In that case, though pressing may be performed by using a batch type press, the pressing can be performed while allowing the dry film to pass through a manufacturing line, and therefore, a roller type press or the like can be used.

Though the thickness of the photoresist layer 15 is not particularly limited, it is preferably 1 μm or more and not more than 500 μm. In the case where the thickness of the photoresist layer 15 falls within this range, the upper conductor post 162 can be sufficiently projected outside the solder resist layer 13 and satisfactory connected to the outside via the conductor post 16. The thickness of this photoresist layer 15 is more preferably 5 µm or more and not more than 300 µm, and especially preferably 10 µm or more and not more than 100 µm.

The foregoing "second through-hole boring process (PR6)" is a process of boring, in the photoresist layer 15, a second through-hole 151 which is allowed to communicate with the first through-hole 131 and which has a larger diameter than that of the first through-hole 131. A photolithographical method can be used. The second through-hole 151 is a through-hole bored in the photoresist layer 15 and that penetrates to the solder resist layer 13. Also, the second through-hole 151 has a diameter larger than that of the first through-hole 131. This second through-hole 151 serves as a mold for forming the upper conductor post 162 which is located above the lower conductor post 161 of the conductor post 16 and projected outside the solder resist layer 13. In view of the fact that this through-hole 151 is bored so as to have a diameter larger than that of the through-hole 131, the lower end surface 162b of the upper conductor post 162 can be formed larger than the upper end surface 161a of the lower conductor post 161, and at least a part of the lower end surface 162b of the upper conductor post 162 can be brought into intimate contact with an outer surface 132 of the solder resist layer 13.

Consequently, a lower end diameter of the through-hole 151 can be larger than an upper end diameter of the through-hole 131. Though the difference of this diameter is not particularly limited, it is preferable that a lower end area of the through-hole 151 (corresponding to an area of the lower end surface 162b of the upper conductor post 162) be more than 1.0 times and not more than 25.0 times an upper end area of the through-hole 131 (corresponding to an area of the upper end surface 161a of the lower conductor post 161). In this range, it is possible to obtain sufficient intimate contact between the lower end surface 162b of the upper conductor post 162 and the outer surface 132 of the solder resist layer 13 while making the pitch between the conductor posts 16 small. Furthermore, this value is more preferably more than 1.0 time and not more than 9.0 times, and especially preferably more than 1.0 time and not more than 4 times. In these ranges, especially excellent effects are obtainable.

More specifically, where the planar shapes of both of the through-hole 131 (corresponding to the lower conductor post 161) and the through-hole 151 (corresponding to the upper conductor post 162) are circular, as shown in FIG. 2, and a diameter of the through-hole 151 (corresponding to a diameter of the lower end surface 162b of the upper conductor post 162) is defined as d162, and a diameter of the through-hole 131 (corresponding to a diameter of the upper end surface 161a of the lower conductor post 161) is defined as d161, d162/d161 is preferably more than 1.0 and not more than 5.0, more preferably more than 1.0 and not more than 3.0, and especially preferably more than 1.0 and not more than 2.0.

In embodiments of the present invention, since the second through-hole 151 can be formed so as to have a diameter larger than that of the first through-hole 131, there is a large tolerance for the position between the first through-hole 131 and the second through-hole 151, and manufacture is easier when compared to the case where the first through-hole 131 and the second through-hole 151 are formed to the same diameter.

Figure 9:
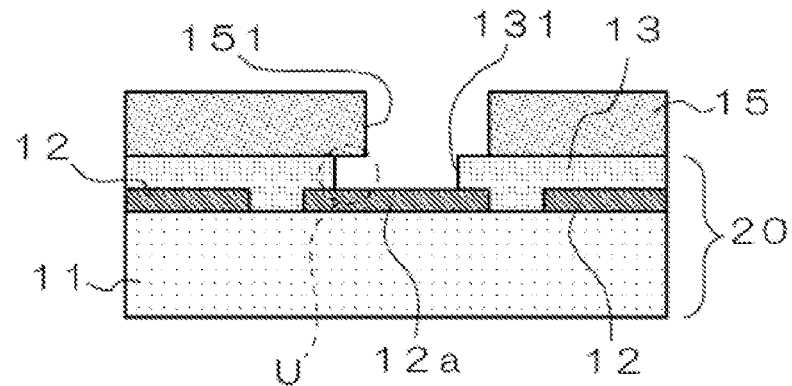
FIG. 9 is an view showing a potential problem in cases where the first through-hole and the second through-hole have the same diameter.
Figure 10:
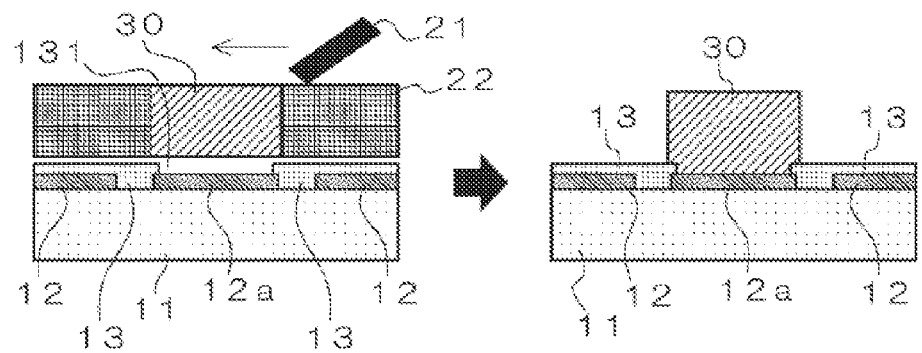
FIG. 10 is a schematic view showing a known manufacturing method.
Figure 11:
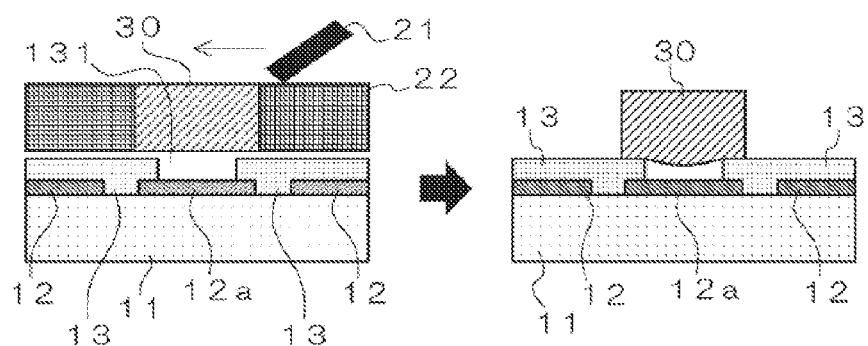
FIG. 11 is a schematic view showing a potential problem of the known manufacturing method shown in FIG. 10.
Figure 12:
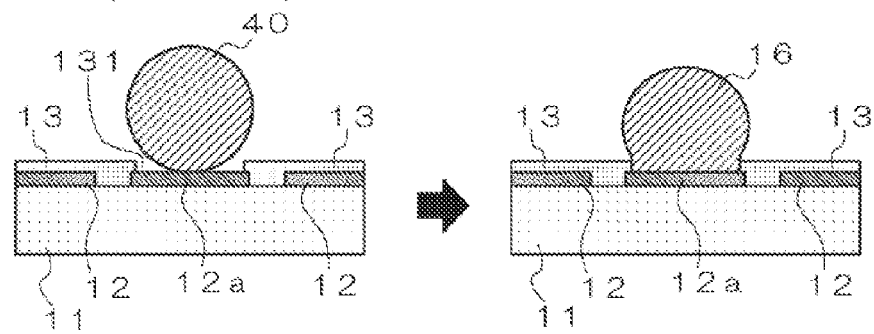
FIG. 12 is another schematic view showing a known manufacturing method.
Figure 13:
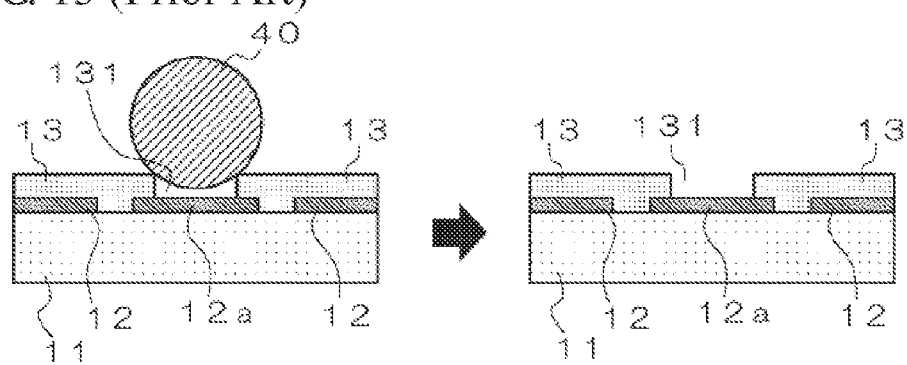
FIG. 13 is another schematic view showing a potential problem of the known manufacturing method shown in FIG. 12.

That is, as illustrated in FIG. 9, in the case where the first through-hole 131 and the second through-hole 151 have the same aperture, when a boring position of the second through-hole 151 is deviated, a submerging portion U of the first through-hole 131 is yielded beneath the second through-hole 151, and hence, such is not preferable.

Figure 7:
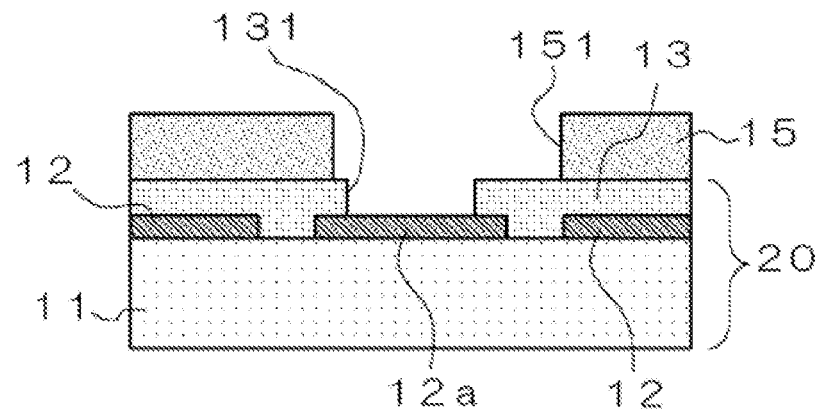
FIG. 7 is an view showing a correlation between a first through-hole and a second through-hole in a manufacturing method of an embodiment.
Figure 8:
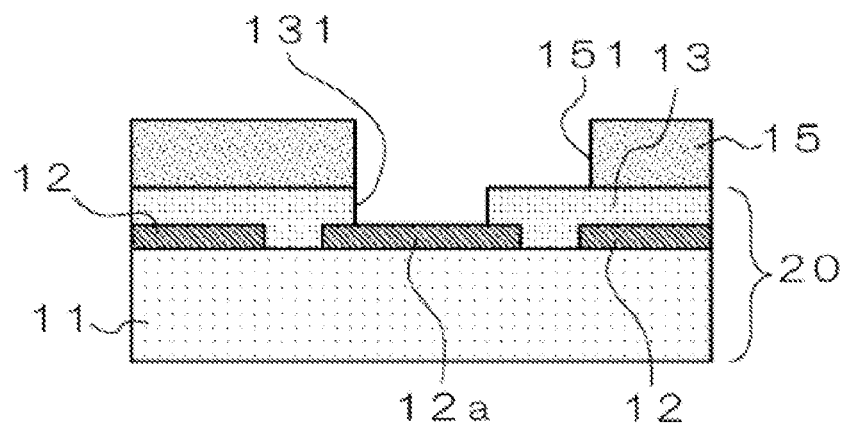
FIG. 8 is an view showing a correlation between a first through-hole and a second through-hole in a manufacturing method of an embodiment.

On the other hand, as illustrated in FIGS. 7 to 8, in the case where the aperture of the second through-hole 151 is larger than that of the first through-hole 131, even when the boring position of the second through-hole 151 is deviated, an intimate contact of the lower end surface 162b of the upper conductor post 162 with the solder resist layer 13 can still be attained. Also, the tolerance for deviation is larger, and the incidences of defects can be conspicuously reduced.

Incidentally, in general, the entirety of an upper end opening surface of the first through-hole 131 is included within a lower end opening surface of the second through-hole 151.

The foregoing "conductor post forming process (PR7)" is a process of plating the conductor post 16 comprises tin, copper, or a solder within the both holes of the first through-hole 131 and the second through-hole 151. In this process PR7, any plating means may be adopted. That is, for example, the conductor post 16 may be formed by means of electroplating, or the conductor post 16 may be formed by means of electroless plating (in particular, high-speed electroless plating). In this conductor post forming process PR7, since the conductor post 16 is plated, as described above, the conductor post 16 becomes a conductor comprising tin, copper, or a solder. When tin, copper, or a solder is a main ingredient, the explanation described above regarding conductor posts 16 can be applied here as well.

The foregoing "photoresist layer removing process (PR8)" is a process of removing the photoresist layer 15. That is, the process PR8 is a process of removing the photoresist layer 15 and exposing the conductor post 16 onto the substrate. The removal of the photoresist layer 15 may be performed by any method. For example, the photoresist layer 15 may be burnt down (reduced to ashes) by applying a laser, heat, or the like, or it may be dissolved and removed by using a solvent or the like. In particular, in the case of using a positive working photoresist as the photoresist, the photoresist layer 15 can be removed simply and easily with a solvent.

In certain embodiments of manufacturing methods of the wiring boards, in addition to the foregoing respective processes, other process can be included. Examples of other processes include an electroless plated layer forming process PR4, an intervening layer forming process PR3, and a conductor post heating process PR10. These processes may be adopted singly or in combination of two or more kinds thereof.

The foregoing "electroless plated layer forming process (PR4)" is a process of coating a palladium-containing catalyst on the outer surface 132 of the solder resist layer 13, after the first through-hole boring process PR2 and before the photoresist layer forming process PR5, to form an electroless plated layer 14 containing copper. According to this, the wiring board 10 containing palladium in the lower end surface 162b of the upper conductor post 162 is brought into intimate contact with the outer surface 132 of the solder resist layer 13.

Furthermore, in this process PR4, the electroless plated layer 14 containing copper can also be formed within the first through-hole 131 in addition to the outer surface 132 of the solder resist layer 13 after similarly coating the palladium-containing catalyst. According to this, the wiring board 10 may contain palladium in the lower end surface 162b of the upper conductor post 162 brought into intimate contact with the outer surface 132 of the solder resist layer 13 as well as in the external side surface 161c of the lower conductor post 161 brought into intimate contact with the internal side surface 131c of the through-hole 131 of the solder resist layer 13. That is, by forming this electroless plated layer 14, a palladium-containing layer can be formed on the periphery of the conductor post 16.

The foregoing palladium-containing catalyst can be formed by coating a liquid, such as a PdCl2 aqueous solution obtained by combining an alkali with a mixed solution of palladium chloride and hydrochloric acid, and an Sn—Pd colloid solution obtained by combining palladium chloride, stannous chloride, and hydrochloric acid, on a necessary surface, or dipping a substrate therein, thereby attaching such a solution, and then drying the surface or substrate.

Also, the electroless plated layer 14 can comprise an electrically conductive metal including at least one of copper, nickel, and tin. This electroless plated layer 14 is preferably an electroless copper plated layer 14 made of copper. The electroless copper plated layer 14 can be formed by dipping in an electroless copper plating solution containing a copper salt (for example, CuSO4, etc.), a reducing agent (for example, formaldehyde, etc.), a complexing agent (for example, a Rochelle salt, EDTA, etc.), a pH modifier (for example, NaOH, KOH, etc.), an additive (for example, polyethylene glycol, dipyridyl, etc.), or the like.

The foregoing "intervening layer forming process (PR3)" is a process of forming an electrically conductive intervening layer 17 containing nickel and gold on the surface of a conductor layer 12a exposed within the first through-hole 131 before the electroless plated layer forming process PR4. By allowing this intervening layer 17 as a primary coat to intervene between the electroless plated layer 14 and the conductor layer 12a before forming the electroless plated layer 14, the formation of a component that may lower the joining strength in cases in which the electroless plated layer 14 becomes the alloy layer 165 (for example, a component in which the respective metal elements are contained in a composition ratio of Cu to Sn of 6/5) can be effectively suppressed. As a result, wiring boards 10 having a conductor post 16 exhibit excellent joining strength.

For example, by applying electroless nickel plating to form an electroless nickel plated layer and then applying electroless gold plating, an electroless gold plated layer is formed on the electroless nickel plated layer, forming an intervening layer 17.

The intervening layer 17 which is formed in this process PR3 may be made of an electrically conductive material containing nickel and gold, and it is not particularly limited in its composition and the like. For example, in the case where the intervening layer 17 is formed of an electroless nickel plated layer and an electroless gold plated layer, when the whole of the electroless nickel plated layer is defined as 100% by mass, the content of nickel is preferably from 90% by mass or more and not more than 95% by mass; and when the whole of the electroless gold plated layer is defined as 100% by mass, the content of gold is preferably from 95 by mass or more and not more than 100% by mass. In the case where the content of each of nickel and gold falls within this range, the formation of a component that may lower the joining strength can be effectively suppressed.

Also, though the thickness of the intervening layer 17 is not particularly limited, it is preferably 1 μm or more and not more than 50 μm. In the case where the thickness of the intervening layer 17 falls within this range, the formation of a component that may lower the joining strength can be more effectively suppressed. The thickness of the intervening layer 17 is more preferably 2 μm or more and not more than 30 μm, and especially preferably 3 μm or more and not more than 20 μm.

The foregoing "conductor post heating process (PR10)" is a process of heating the conductor post 16 after the photoresist layer removing process PR8. This conductor post heating process PR10 is a process for when in the conductor post forming process PR7 the conductor post 16 is made of tin or the like and is plated within the both holes of the first through-hole 131 and the second through-hole 151.

By performing this conductor post heating process PR10, in the case where the electroless plated layer 14, the intervening layer 17, and the like are previously formed before the conductor post forming process PR7, an alloy layer 165 can be formed wherein the components of these layers have been incorporated on the surface of the conductor post 16. When the alloy layer 165 is formed, a wiring board 10 with a more firmly arranged conductor post 16 can be obtained.

Furthermore, by performing this conductor post heating process PR10, the shape of a conductor post 16 which has been formed prior to the process PR10 can be corrected. That is, according to this heating, not only is the conductor post 16 is moderately dissolved, but the contortions of the shape of the upper conductor post 162 due to its surface tension and can be rounded and corrected. Moreover, the position of the upper conductor post 162 can be corrected so as to allow an axial center thereof to coincide with the conductor layer 12a due to a self-alignment effect. Accordingly, the resulting wiring board 10 may have a conductor post 16 with excellent reliability.

Figure 6:
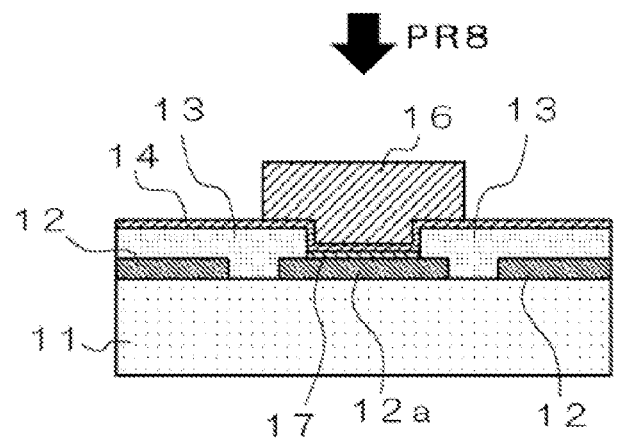
FIG. 6 is a schematic process chart that follows from FIG. 5 and that shows a manufacturing method of an embodiment.
Figure 6:
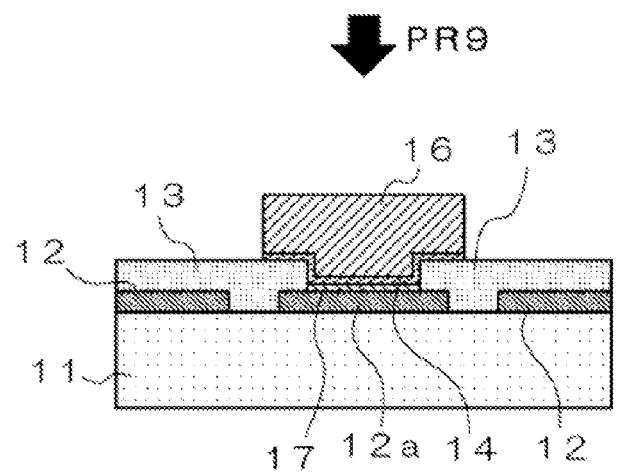
Figure 6:
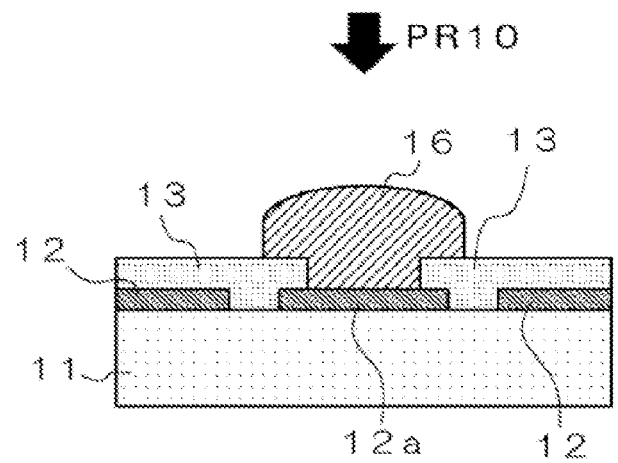

Also, as illustrated as a stage after the process PR9 in FIG. 6, in the case where the electroless plated layer 14 is formed between the lower end surface 162b of the upper conductor post 162 and the surface 132 of the solder resist layer 13, in particular, the adhesion therebetween can be enhanced.

The heating conditions in the conductor post heating process PR10, or the like are not particularly limited so long as the maximum attained temperature is a melting point of the conductor post 16 or higher. However, for example, it is preferable that the conductor post 16 be allowed to reflow at a temperature of 100° C. or higher and not higher than 400° C. in a nitrogen atmosphere, thereby effecting heating and dissolution. When the temperature falls within this range, the foregoing self-alignment effect can be obtained while moderately accelerating the formation of the alloy layer 165. This temperature is more preferably 120° C. or higher and not higher than 350° C., and especially preferably 150° C. or higher and not higher than 300° C.

In the method according to an embodiment of the invention, in addition to the foregoing respective processes, other processes can be included. Examples of other process include a desmearing process. The desmearing process can be performed after forming the first through-hole 131, and/or after forming the second through-hole 151, or the like. By performing this desmearing process, a residue within the through-hole can be removed.

Furthermore, as illustrated as the process PR9 in FIG. 6, there is exemplified an electroless plated layer removing process PR9 of removing an unnecessary site of the electroless plated layer 14.

These processes may be adopted singly or in combination with two or more kinds thereof.

EMBODIMENT

The wiring board 10 of the invention is more specifically described below with respect to the following specific Embodiment, but it should not be construed that the invention is limited to this Embodiment.

(1) Wiring Board 10:

A wiring substrate 10 (see FIG. 1) which is manufactured according to this Embodiment includes a conductor layer 12 laminated on the side of one surface of a core substrate 11, a solder resist layer 13 laminated on this conductor layer 12, and a conductor post 16 that is electrically connected to a conductor layer 12a which is disposed in a lower portion of a through-hole 131 provided in the solder resist layer 13.

The core substrate 11 comprises glass epoxy (epoxy resin containing glass fibers as a core material) having a thickness of 0.8 mm. Also, the conductor layer 12 is obtained by patterning a copper foil having a thickness of 12 μm on one surface of the core substrate 11.

Furthermore, the solder resist layer 13 has a thickness of 21 μm and contains an epoxy resin that is a thermosetting resin (the solder resist layer 13 contains 40% by mass of a filler made of silica and 60% by mass of an organic material, and furthermore, the organic material contains 80% by volume of an epoxy resin based on 100% by volume of the whole thereof). The through-hole 131 bored in the solder resist layer 13 has a circular shape having an aperture of 64 μm and penetrates the back and front sides to the conductor layer 12a beneath the solder resist layer 13.

The conductor post 16 is filled up within the through-hole 131 and comprises a lower conductor post 161 having a diameter (d161) of 64 μm and a height of 21 μm and an upper conductor post 162 located on this lower conductor post 161 and having a diameter (d162) of 74 μm and a height (at the highest position) of 58 μm.

Also, the lower conductor post 161 includes an external alloy layer 165c having an average thickness of 2 μm on an external side surface 161c and a lower end alloy layer 165b having an average thickness of 1 μm on a lower end surface 161b. That is, the external alloy layer 165c is twice as thick as the lower end alloy layer 165b.

Furthermore, the conductor post (inclusive of an alloy layer 165 having an average thickness of 2 μm) comprises about 95% by mass of tin based on 100% by mass of the whole thereof. The remainder may comprise palladium, copper, nickel, and gold may be components of the alloy layer 165.

Then, the lower end surface 162b of the upper conductor post 162 is brought into intimate contact with the outer surface 132 of the solder resist layer 13 in a site thereof at which the lower conductor post 161 is not located.

Figure 4:
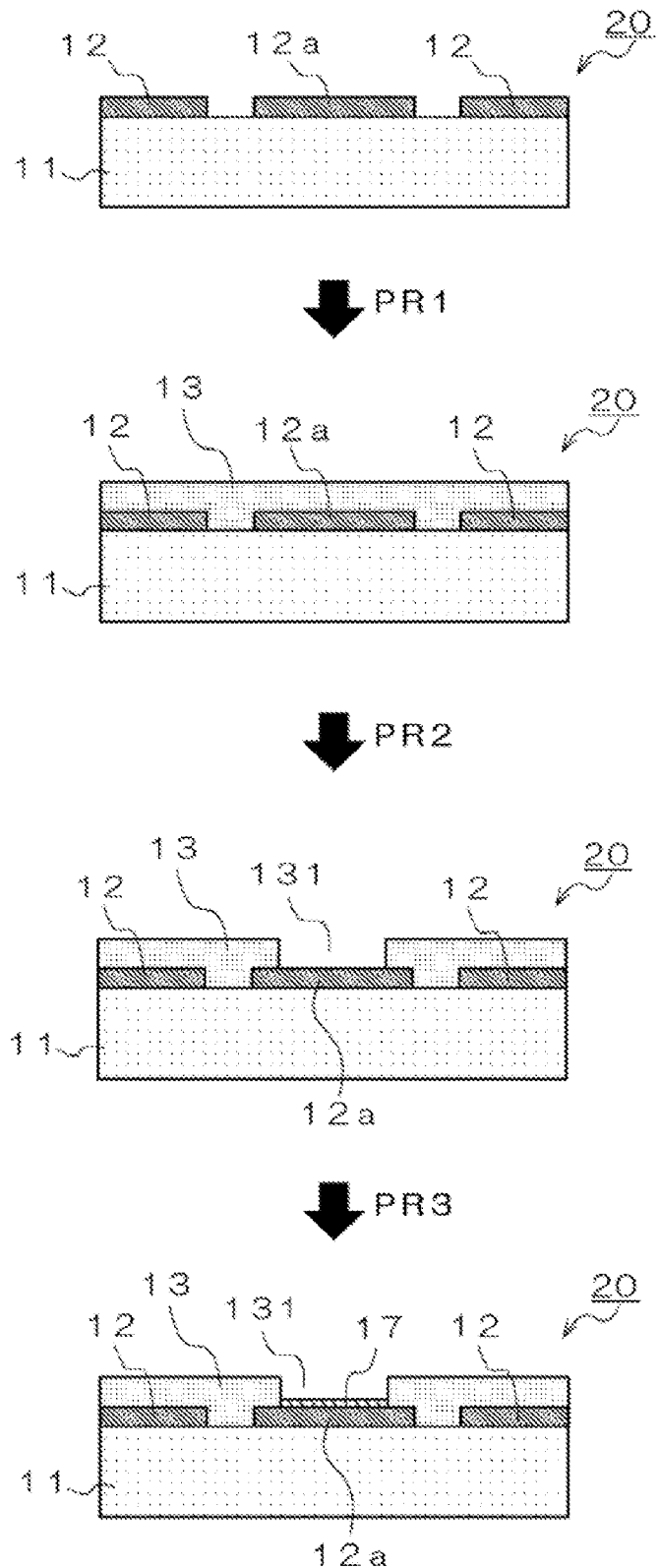
FIG. 4 is a schematic process chart showing a manufacturing method of a wiring board in an embodiment.
Figure 5:
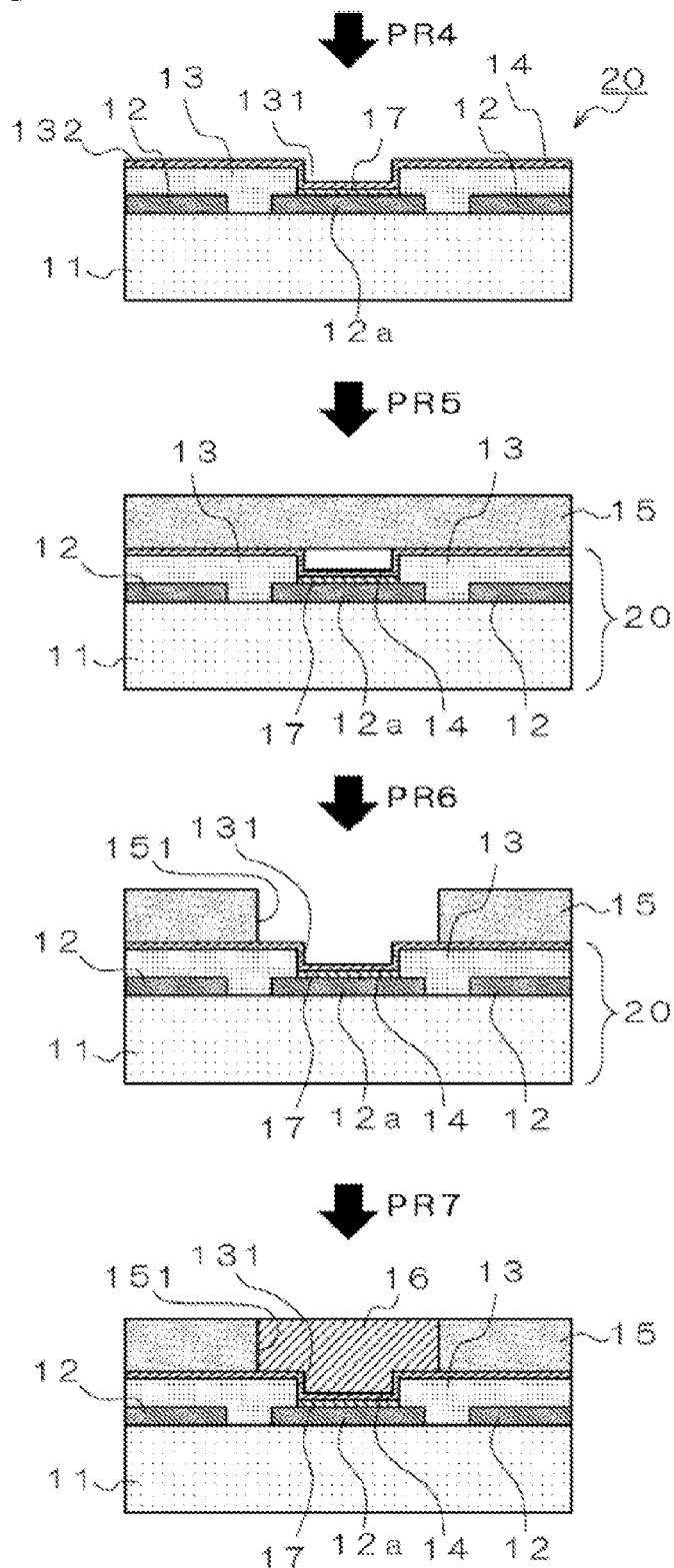
FIG. 5 is a schematic process chart that follows from FIG. 4 and that shows a manufacturing method of an embodiment.

Specific embodiments of manufacturing methods of the wiring board 10 are hereunder described by reference to FIGS. 4 to 6. Incidentally, since it is complicated to use a different terms, the substrate on the way of manufacture in each of the processes and substrates in the respective processes before becoming wiring boards 10 are all called a plain substrate 20.

A plain substrate 20 used in process PR1 (FIG. 4) includes a core substrate 11 composed of glass epoxy (epoxy resin containing glass fibers as a core material) having a thickness of 0.8 mm and a conductor layer 12 obtained by patterning a copper foil having a thickness of 12 μm as stuck on one surface of the core substrate 11.

(2) Solder Resist Layer Forming Process PR1:

A film-like solder resist layer forming composition containing an epoxy resin that is a thermosetting resin is stuck onto the surface of the side on which the conductor layer 12 of the plain substrate 20 of the foregoing (1) is provided and then is heated for curing, thereby obtaining a thermosetting resin-containing solder resist layer 13 having a thickness of 21 μm.

(3) First Through-Hole Boring Process PR2:

A laser is irradiated on the solder resist layer 13 obtained in the foregoing (2) from the surface side, thereby boring a first through-hole 131 having a diameter of 60 μm. According to this, a conductor layer 12a beneath the solder resist layer 13, for which continuity is necessary, is exposed. Also, thereafter, a desmearing treatment is performed for the purpose of removing a smear within the through-hole 131.

(4) Intervening Layer Forming Process PR3:

An electroless nickel plated layer is formed on the surface of the exposed conductor layer 12a beneath the solder resist layer 13 of the plain substrate 20 that was subjected to a smearing treatment, as obtained in the foregoing (1)-(3), by means of electroless nickel plating, and thereafter, an electroless gold plated layer formed by means of electroless gold plating, thereby forming an electrically conductive intervening layer 17 containing nickel and gold. The resulting intervening layer 17 contains 93% of nickel in the case of defining the whole of the electroless nickel plated layer as 100% by mass and 100% by mass of gold in the case of defining the whole of the electroless gold plated layer as 100%, respectively and has a thickness of 10 μm.

(5) Electroless Plated Layer Forming Process PR4:

The plain substrate 20 is dipped in a palladium catalyst solution containing palladium and the like and then dried, thereby forming a palladium-containing catalyst nucleus on the whole surface (side on which the solder resist layer 13 is provided) of the plain substrate 20, including the intervening layer 17 as obtained in the foregoing (1)-(4). Subsequently, the plain substrate 20 in which the catalyst nucleus has been formed is dipped in an electroless Cu plating solution and then dried, thereby forming an electroless copper plated layer 14. The resulting electroless copper plated layer 14 has a thickness of 0.7 μm.

(6) Photoresist Layer Forming Process PR5:

A dry film type photoresist layer 15 having a thickness of 75 μm is contact bonded onto the surface of the plain substrate 20 on which the electroless copper plated layer 14 is formed, as obtained in the foregoing (1)-(5).

(7) Second Through-Hole Boring Process PR6:

A second through-hole 151 which is allowed to communicate with the first through-hole 131 and which has a diameter larger than that of the first through-hole 131 is bored in a laminate having the photoresist layer 15 laminated on the surface of the plain substrate 20, as obtained in the foregoing (1)-(6), by adopting a photolithography method. That is, the second through-hole 151 is formed through an exposure process, a development process, and the like. The second through-hole 151 has a diameter of 74 μm and is bored so as to have a diameter larger than that of the first through-hole 131, and the surface (partial surface) of the electroless copper plated layer 14 beneath the photoresist layer 15 is exposed within the second through-hole 151.

(8) Conductor Post Forming Process PR7:

The laminate having the second through-hole 151 formed in the photoresist layer 15 as obtained in the foregoing (1)-(7) is dipped in an electroless plating solution to effect electroplating, and the insides of the both holes of the first through-hole 131 and the second through-hole 151 are filled up with a tin plating, thereby forming a conductor post 16.

(9) Photoresist Layer Removing Process PR8:

The photoresist layer 15 is removed from the surface of the laminate having the conductor post 16 formed therein, as obtained in the foregoing (1)-(8), by dipping in an amine based stripping solution.

(10) Electroless Plated Layer Removing Process PR9:

An unnecessary portion of the electroless copper plated layer 14 which is formed on the surface of the solder resist layer 13 in the plain substrate 20, including the conductor post 16, as obtained in the foregoing (1)-(9), is removed by spraying a sulfuric acid/hydrogen peroxide based solution and etching.

(11) Conductor Post Heating Process PR10:

The plain substrate 20 from which the unnecessary portion of the electroless copper plated layer 14 has been removed, as obtained the foregoing (1)-(10) is subjected to reflowing for heat melting at a temperature of a melting point of the conductor post or higher in a prescribed furnace. As for a detailed reflowing condition, a temperature of the melting point or higher is kept for 50 seconds with a maximum temperature being 240° C. According to this, as shown in FIG. 6, alloying (diffusion of metal elements) is accelerated at an interface of each of the parts of the intervening layer 17, the electroless copper plated layer 14, and the tin plating, whereby not only the conductor post 16 becomes an integrated single conductor, but an external alloy layer 165c and a lower end alloy layer 165b are formed. Furthermore, the conductor post 16 approaches onto the central axis of the conductor layer 12a due to a self-alignment effect and is also molded into a circular form due to a surface tension of molten tin.

The invention can be widely utilized in the electronic part-related fields. Also, embodiments of the wiring board of the present invention are utilized for usual wiring boards such as motherboards; wiring boards for mounting semiconductor device such as wiring boards for flip chips, wiring boards for SCPs, and wiring boards for MCPs; wiring boards for modules such as wiring boards for antenna switch modules, wiring boards for mixer modules, wiring boards for PLL modules, and wiring board for MCMs; and the like.

What is claimed is:

1. A wiring board comprising:
   a conductor layer;
   a solder resist layer comprised of thermosetting resin and laminated on the conductor layer, the solder resist layer defining a through-hole extending through the solder resist layer such that a portion of the conductor layer is located below the through-hole; and
   a conductor post comprised of tin, copper, or a solder that is electrically connected to the portion of the conductor layer below the through-hole, the conductor post including a lower conductor post and an upper conductor post located above the lower conductor post;
   wherein the
   lower conductor post is located within the through-hole and includes an external side surface with an external alloy layer comprised of copper and tin, and a lower end surface with a lower end alloy layer comprised of copper and tin; and
   wherein the upper conductor post projects outside the solder resist layer and
   at least a part of a lower end surface of the upper conductor post is brought into intimate contact with an outer surface of the solder resist layer.

2. The wiring board according to claim 1, wherein the part of the lower end surface of the upper conductor post that is brought into intimate contact with the outer surface of the solder resist layer comprises palladium.

3. The wiring board according to claim 1, wherein a part of the external side surface of the lower conductor post is brought into intimate contact with an internal side surface of the through-hole of the solder resist layer and comprises palladium.

4. The wiring board according to claim 1, wherein at least a part of the lower end surface of the lower conductor post is brought into intimate contact with the conductor layer and comprises nickel and gold.

5. The wiring board according to claim 1, wherein the external alloy layer is thicker than the lower end alloy layer.

* * * * *